United States Patent [19]
Pierce et al.

[11] Patent Number: 5,331,220
[45] Date of Patent: Jul. 19, 1994

[54] SOFT WAKEUP OUTPUT BUFFER

[75] Inventors: Kerry M. Pierce; Charles R. Erickson, both of Fremont, Calif.

[73] Assignee: Xilinx, Inc., San Jose, Calif.

[21] Appl. No.: 16,643

[22] Filed: Feb. 12, 1993

[51] Int. Cl.$^5$ .................... H03K 19/092; H03K 19/00
[52] U.S. Cl. .................................... 307/475; 307/473; 307/451
[58] Field of Search ............... 307/475, 473, 451, 465, 307/443

[56] References Cited

U.S. PATENT DOCUMENTS

| | | | |
|---|---|---|---|
| 4,820,942 | 4/1989 | Chan | 307/473 |
| 4,870,302 | 9/1989 | Freeman | 307/465 |
| 4,880,997 | 11/1989 | Steele | 307/473 |
| 5,013,940 | 5/1991 | Ansel | 307/443 |
| 5,017,813 | 5/1991 | Galbraith et al. | 307/473 |
| 5,118,974 | 6/1992 | Yarbrough et al. | 307/473 |
| 5,220,209 | 6/1993 | Seymour | 307/473 |

*Primary Examiner*—Edward P. Westin
*Assistant Examiner*—Richard Roseen
*Attorney, Agent, or Firm*—Edel M. Young

[57] ABSTRACT

Power or ground voltage can fluctuate when many high capacitance terminals of an integrated circuit device move simultaneously from one logic state to another. This occurs particularly after release of a global high impedance state of output buffers where output signals have been passively driven to a selected logic state. To prevent supply and ground voltage variations, the buffers are provided with means for operating in a slow response (high slew) mode. A slew rate control circuit moves the buffer to slow response mode in response to the high impedance signal. When the slew rate control circuit receives a signal ending the high impedance state of the buffer, it applies a delay to this signal, and after the delay time allows the buffer to move to a fast response mode. The slow buffer response and resulting slow voltage change when high capacitance terminals move to a new logic state prevents fluctuation of power or ground voltage in response to simultaneous switching of many terminals.

1 Claim, 5 Drawing Sheets

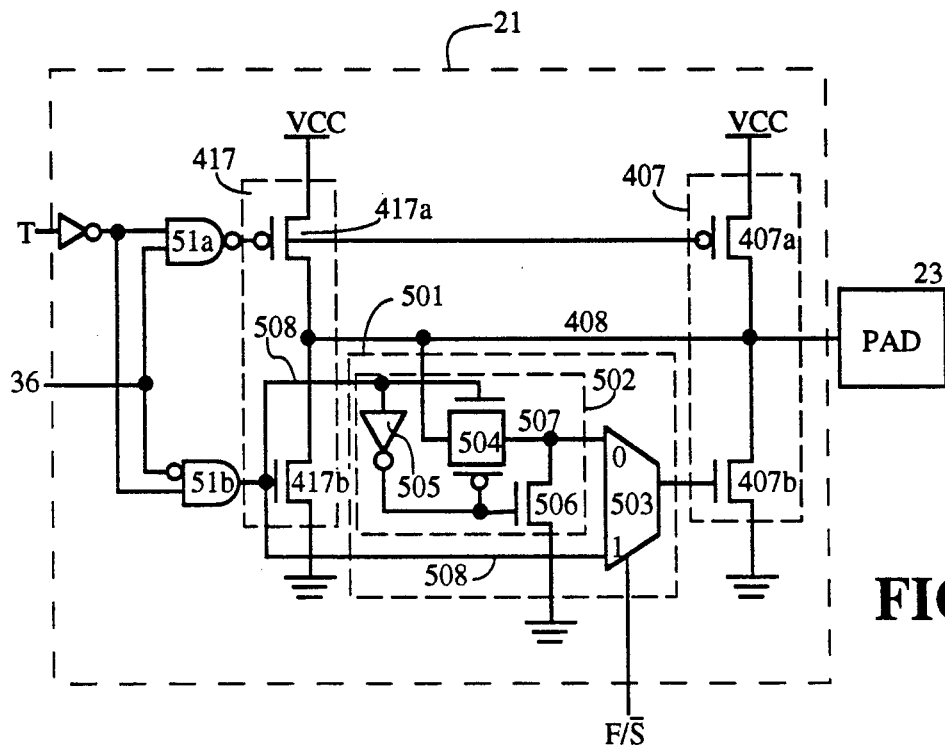
FIG. 5
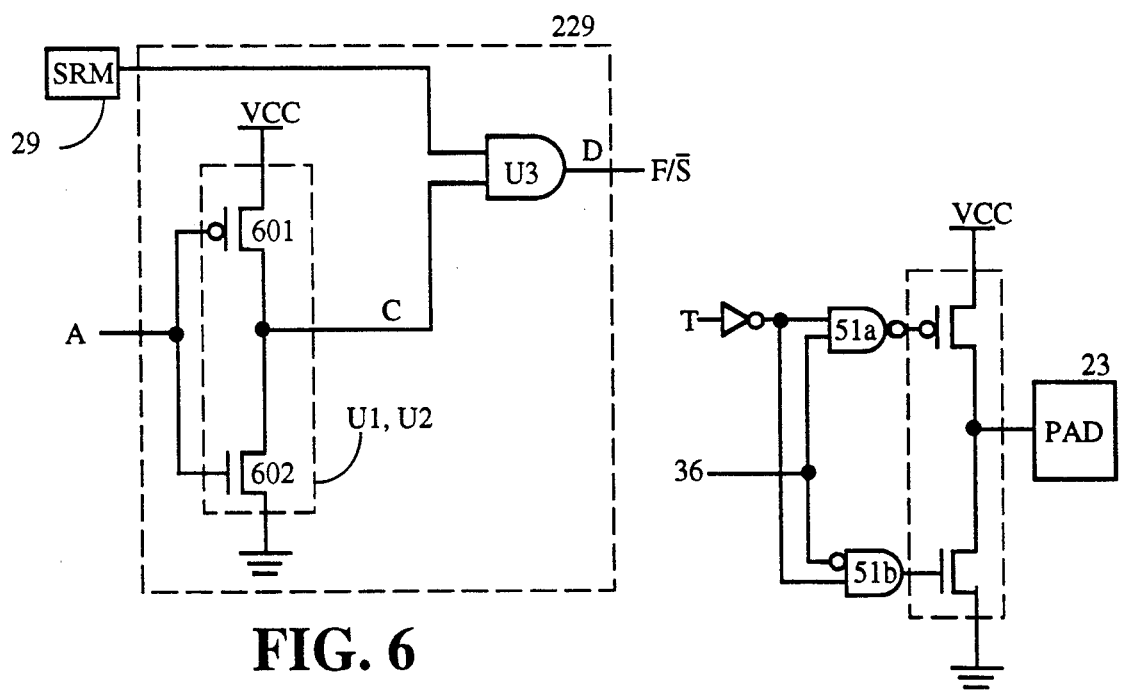
FIG. 6
FIG. 8

SOFT WAKEUP OUTPUT BUFFER

FIELD OF THE INVENTION

The present invention relates to circuitry for controlling buffers in an integrated circuit device, particularly output buffers which might be switched simultaneously.

BACKGROUND OF THE INVENTION

The invention relates to many kinds of integrated circuit devices, for example application specific gate array devices, PLAs, microprocessors, and custom integrated circuit devices. However, the invention will be described in connection with field programmable integrated circuit devices (FPGAs). Therefore FPGAs are described in some detail here. FPGAs such as those made by Xilinx, Inc. comprise programmable elements and interconnect devices which are programmed by turning on selected transistors. FIG. 1 shows the architecture of a prior art FPGA integrated circuit device made by Xilinx, Inc. Around the perimeter of the chip are input/output buffers (IOBs) such as IOB1 through IOB8. In the interior of the chip are configurable logic blocks (CLBs) such as CLB1 through CLB4. Also in the interior of the chip are switch boxes such as SB1 through SB4. For simplicity, only a few IOBs, CLBs and switch boxes are labeled. Not shown in FIG. 1 is a structure of interconnect lines which run horizontally and vertically from one switch box to another. Also not shown are input and output lines which extend outward from the CLBs in all four directions. However, dots in FIG. 1 represent programmable connections from the interconnect lines in the interconnect structure to lines extending from the CLBs. The switch boxes include a plurality of programmable transistors which can connect one line entering the switch box to other lines entering the switch box. A data book entitled "The Programmable Gate Array Data Book", ©1992 available from Xilinx, Inc. at 2100 Logic Drive, San Jose, Calif. 95124 describes these IOBs, CLBs and switch boxes in more detail. Such devices are also described in Freeman U.S. Pat. No. 4,870,302, incorporated herein by reference.

Functions performed by the CLBs are selectable, and the interconnections between IOBs and CLBs are selectable. Certain of the IOBs have special functions, and during configuration are used for loading the bit stream for configuring the remainder of the chip. After configuration is complete these IOBs used for configuration act as other IOBs. Most external pins are connected to pads which connect to IOBs. However, certain external pins are dedicated to power, ground, and clock lines.

When a Xilinx FPGA device is not powered up, it is not programmed to have any particular configuration. Configuration information is loaded into the chip after the chip is powered up. To select a desired configuration, a user (with the aid of sophisticated software) selects a set of transistors to be turned on and another set to be turned off to achieve the desired configuration. The software generates a bit stream to select the transistors to be turned on or off for the desired configuration. The bit stream is loaded into the FPGA through a shift register such that each bit is eventually loaded into the memory cell for which it was intended. Then the information in the collection of memory cells turns on or off specific transistors to implement the desired configuration. A transistor is programmed by loading a value into a memory cell which drives the gate of the transistor. A memory cell may control more than one transistor. Xilinx uses a lookup table to represent a logic function and a set of memory cells actually represents the logic function.

IOBs may be configured as off, input, output, or input/output ports. FIG. 2 shows in more detail an IOB such as IOB1 of FIG. 1. The IOB includes an output buffer 21 and an input buffer 22. These buffers are CMOS circuits. Both are connected to I/O pad 23 which is directly connected to an external pin of the integrated circuit. If I/O pad 23 were left floating during configuration, it could move to an intermediate voltage level. It is well known that CMOS input voltages should not remain at intermediate voltage levels because P-channel and N-channel transistors in series between power and ground might be turned on simultaneously, drawing undesirably large currents. In the IOB of FIG. 2, I/O pad 23 should not be left floating because a floating input to buffer 22 can produce an undesirable current. To prevent this, Xilinx provides a weak pullup transistor 27 which is resistive in its on state, as represented by resistor 26. During configuration, transistor 27 is turned on by pullup control logic circuit 28 (typically a global signal for all IOBs) When configuration is complete, pullup transistor 27 is turned off. I/O pad 23 (a large capacitance element) then moves to a voltage determined by the configuration state. If I/O pad 23 is not to be used, the user loads a logical 1 into memory cell 38 or 39 to turn on pullup transistor 41 or pulldown transistor 42. At the end of configuration, the high DONE signal turns on transistor 45. The resulting constant Vcc or ground signal on pad 23 can be used to cause input buffer 22 to provide a power or ground signal in addition to preventing the input of buffer 22 from floating.

Also shown in FIG. 2 is slew rate control means 29, which selects between a state in which output buffer 21 provides fast slew response to a signal on line 36, and a state in which output buffer 36 provides slow slew response to the signal on line 36.

Ground Instability

A problem may occur at the point where configuration is complete and many output buffers 21 are simultaneously leaving their high impedance states. If many output buffers 21 are to provide a logical low voltage level, and many pads 23 must simultaneously switch from the high logic level during configuration to a logic zero level to begin operation, the temporary current flow from the load at the pad to the ground line and other structures which are switching to logic zero may pull the ground line voltage level high enough to disturb input logic signals of the chip and cause logic malfunction of the chip or other chips in a system which may be connected to this chip.

Similarly, during testing for current leakage, the output buffers 21 will be held in their high impedance state. After testing, a large number of IOBs may transition from a high state to a low state simultaneously. When lines 34 in many IOBs simultaneously take output buffers 21 out of their high impedance states, low values stored in flip flops 31 or on output lines 35 will be applied to I/O pads 23, causing a current flow from pads 23 through buffers 21 to the ground line, again undesirably pulling up the ground line.

It is desirable to minimize such fluctuation in ground voltage.

SUMMARY OF THE INVENTION

In accordance with the present invention, a circuit is provided for controlling slew rate independently of any prior art slew rate control which may be selected by a user. The signal which controls the circuit pullup transistors also is input to a delay circuit which controls slew rate. In addition to a slew rate control signal which may be provided by a user, a delay circuit receives the control signal for placing the circuit into operation. This circuit applies a delay before generating an output signal which changes the slew rate to a fast response mode. Thus the output buffer goes out of its high impedance state promptly in response to the control signal but operates in a slow response mode for a selected period of time, thus switching gradually to a logic zero (if an input signal is logic zero). The selected period of time should be sufficient to allow the voltage shift to logic zero to be completed for reasonable loading conditions. This gradual lowering of I/O pad voltage prevents a significant transient rise in ground voltage when multiple buffers transition simultaneously.

In one embodiment, the control signal is a logical function of a configuration completion signal (DONE) and a global three-state buffer signal (GTSB). In another embodiment in which many signals switch simultaneously during testing of buffers, the control signal is a logical function of a test mode signal. The control signal may be a function of any signal which causes the simultaneous switching of many circuits such as IOBs from one logic level to the other.

BRIEF DESCRIPTION OF THE DRAWINGS

FIG. 5 shows a preferred implementation of the output buffer of FIG. 3.

FIG. 6 shows a preferred implementation of the delay circuit of FIG. 3.

FIG. 8 shows an implementation of the output buffers used in/ FIG. 7.

DETAILED DESCRIPTION OF ONE EMBODIMENT OF THE INVENTION

Figure 1:
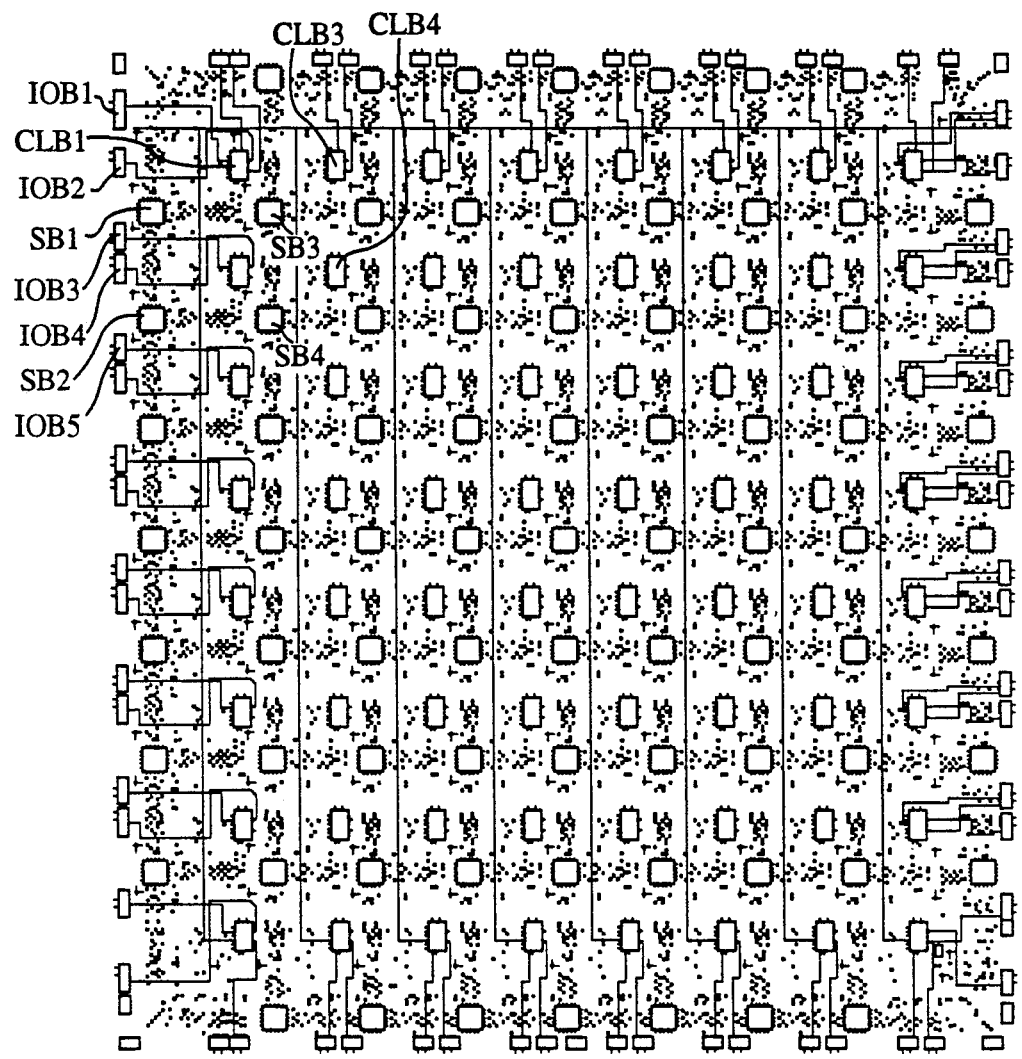
FIG. 1 (prior art) shows a representation of a Xilinx FPGA.
Figure 2:
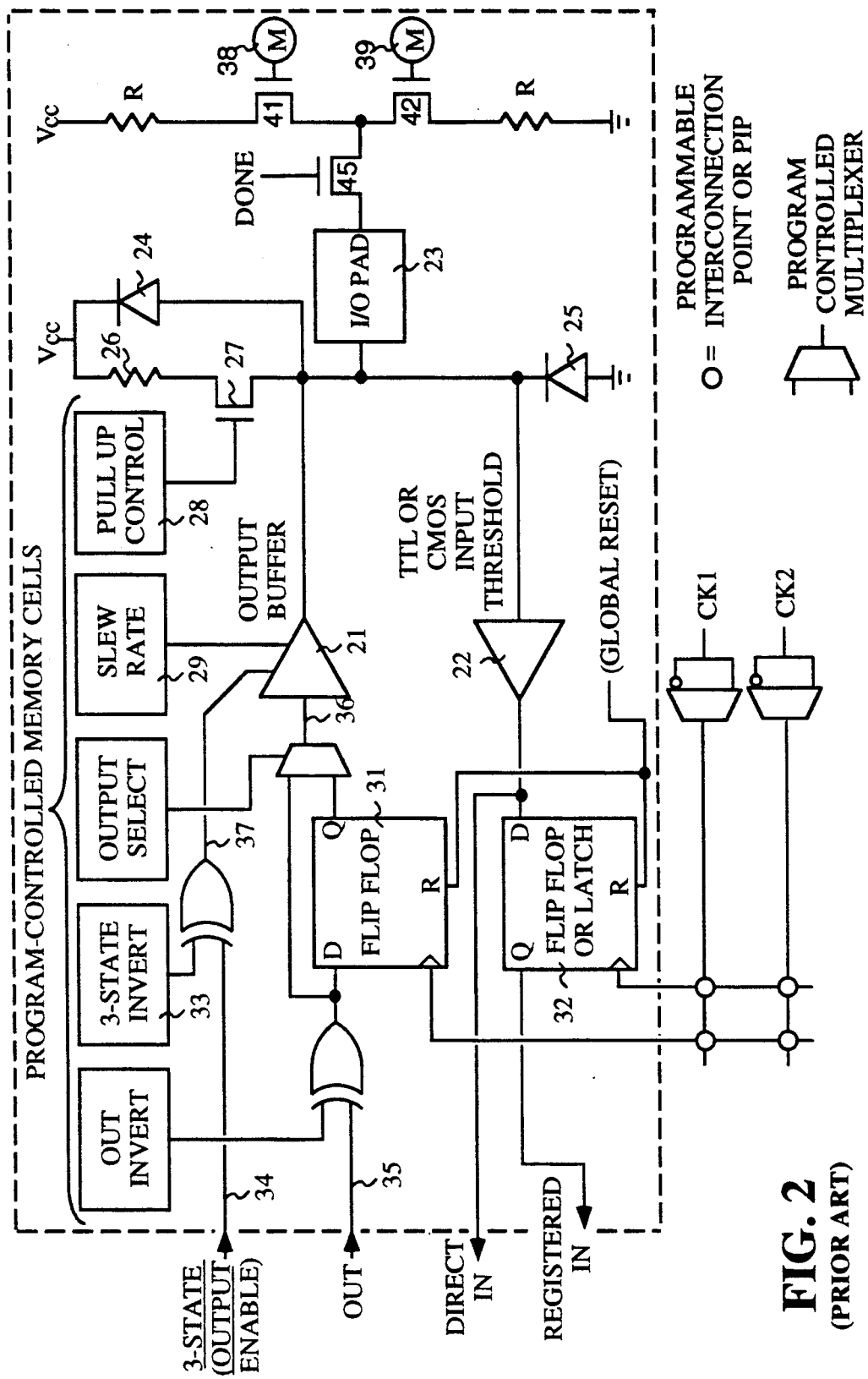
FIG. 2 (prior art) shows an input/output buffer (IOB) in a Xilinx FPGA.
Figure 3:
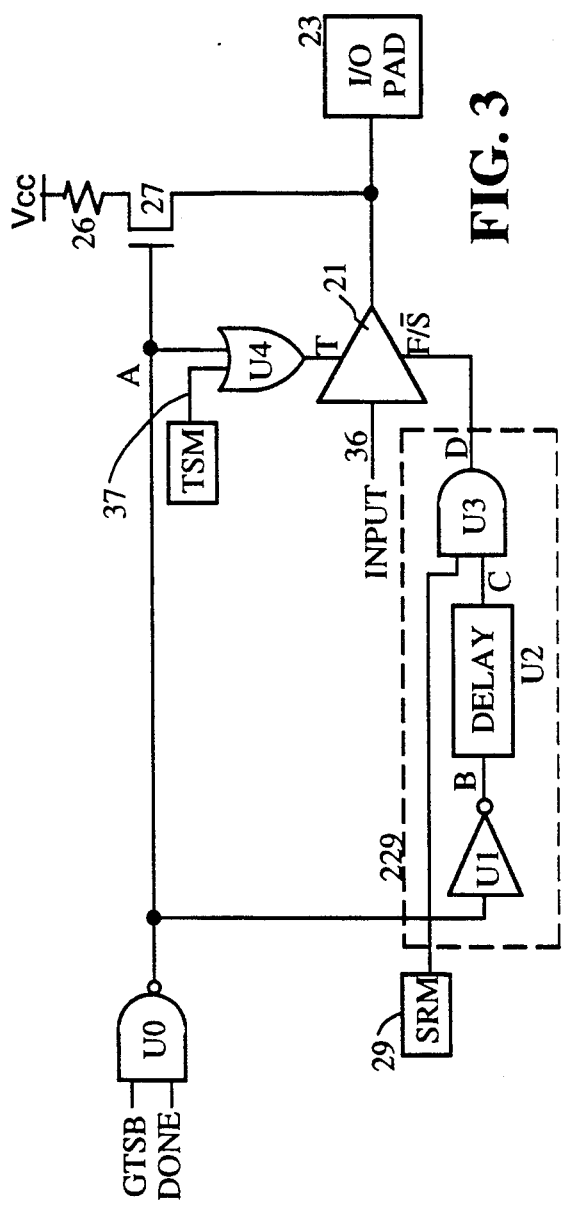
FIG. 3 shows a slew rate control circuit according to the present invention.

FIG. 3 shows a slew rate control circuit according to the present invention. Components of FIG. 3 which correspond to those of FIG. 2 are given the same reference numerals. For example, present in both figures are pullup transistor 27, output buffer 21, input line 36, slew rate mode control 29, three-state enable signal line 37, and I/O pad 23. However, in the novel circuit of FIG. 3, delay circuit 229 adds delay before combining the signal on line A (which also controls pullup transistor 27) with the slew rate mode control 29. Only when the output signal from slew rate mode control 29 and the output from delay circuit 229 are both high will buffer 21 move to its fast response mode. In the embodiment of FIG. 3, delay circuit 229 comprises an inverter U1, a delay circuit U2 and an AND gate U3. When global tristate bar signal GTSB and configuration completion signal DONE are both high, indicating that the circuit is not in a global tristate mode (for testing) and that configuration is complete, the low output signal A from NAND gate U0 does three things:

1) turns off pullup transistor 27 so that I/O pad 23 may be driven from another source without current drain through transistor 27;
2) causes OR gate U4 to apply a low signal to buffer 21, taking buffer 21 out of high impedance mode if the TSM signal is low; and
3) applies a low signal to the input of inverter U1.

Figure 4:
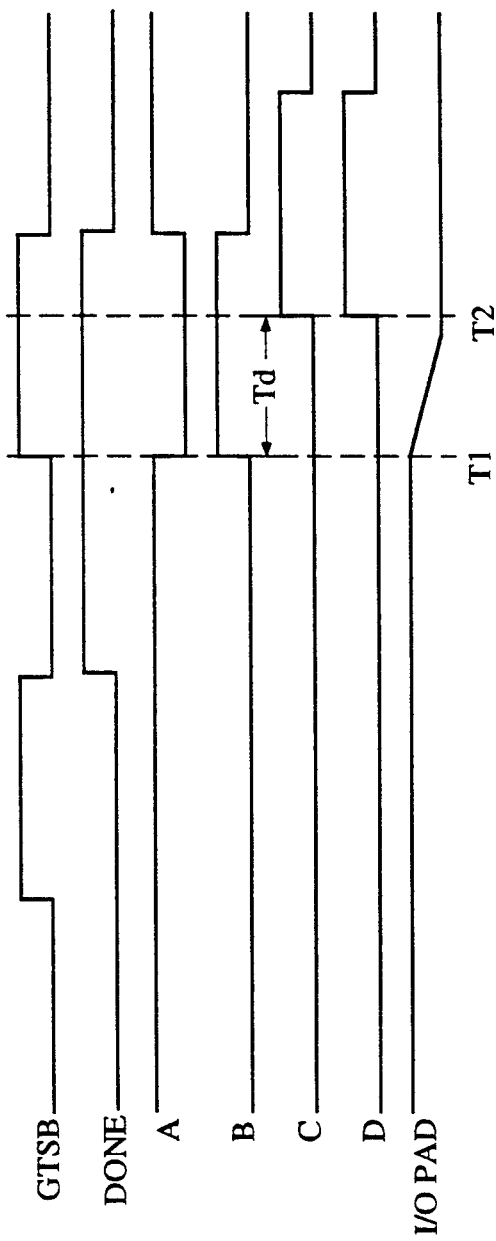
FIG. 4 shows a timing diagram for signals in the circuit of FIG. 3.

As shown in FIG. 4, the low signal A to inverter U1 produces a high signal B at the output of inverter U1, which is applied to delay circuit U2. After a time delay Td, the output C of delay circuit U2 goes high in response to the high input signal B. If slew rate mode control 29 carries a high signal, output D from AND gate U3 goes high in response to signal C going high. Signal D is the slew rate control signal F/S̄ to buffer 21. At time t1, when signal A went low, buffer 21 went out of high impedance mode. Thus, I/O pad 23 began to move to logic zero (assuming input signal on line 36 is logic zero). Because buffer 21 remains in a slow response mode during the time Td provided by delay circuit U2, the voltage on I/O pad 23 moves gradually from logic one value at time t1 to a logic zero some time later. Delay circuit U2 is constructed to provide sufficient delay such that I/O pad 23 has moved close to logic zero before buffer 21 is released from its slow response mode at time t2.

Once signal C has moved to a high value, the fast/slow control of buffer 21 will be determined by slew rate mode control 29. In the fast mode, which is desirable in most situations, a change in the input signal on line 36 will produce a fast switch in the signal on I/O pad 23.

FIG. 5 shows a preferred implementation of output buffer 21. High impedance control signal T, buffer input signal 36, and slew rate control signal F/S̄ are the same as those signals shown in FIG. 3. Pad 23 is also the same as pad 23 of FIG. 3. When slew rate control signal F/S̄ is in fast mode (logic high), multiplexer 503 selects the direct input from line 508. When slew rate control signal F/S̄ is in the slow mode (logic zero), the signal from transmission gate 504 is applied to pull-down transistor 407b. Pull down transistor 506 turns on when transmission gate 504 is off, preventing a floating input on line 507 in the case where the signal on line 508 is a logical 0. As the signal on line 508 moves to logical 1, and as pad 23 moves toward zero volts, the lowering voltage on line 507 is passed by multiplexer 503 to the gate of transistor 407b, turning this transistor gradually off such that the variation in ground voltage is minimized. Note that if transistor 407b is fully off, and transistor 506 is off, that line 507 which passes through multiplexer 503 to the gate of transistor 407b can be left floating. But if the gate of transistor 407b floats to a high enough voltage to turn transistor 407b partly on, the corresponding decrease in voltage on line 408 again lowers the voltage on line 507. Thus no intermediate voltage persists. Small transistor 417b pulls the output voltage to the ground rail and prevents drifting of the voltage on pad 23 when buffer 21 is in its slow slew rate mode. Signal 36 and the inverted signal from high impedance control signal T are applied to NAND gate 51a and AND gate 51b. Input signal 36 is inverted at the input to NAND gate 51b. The result is that a low signal T allows buffer 21 to respond to signal 36 and a high signal T causes buffer 21 to turn off regardless of the value of signal 36.

FIG. 6 shows a preferred embodiment of inverter U1 and delay circuit U2 of FIG. 3. A single CMOS inverter can both invert and delay if the transistor sizes are carefully controlled. In particular the conductivity of P-channel transistor 601 is made small, preferably so that the channel length is greater than the channel width. With such characteristics, inverter U1 has a low trip point, and the output at C does not begin to rise until the voltage of signal A has fallen significantly below 5 volts, in one embodiment, to approximately 1.0 volts. Even when transistor 601 does turn on, the long channel length and small width produces resistance so that current flow from Vcc to line C is small, thus the input voltage to AND gate U3 does not rise to the trip point of AND gate U3 for a period of time Td after signal A goes low. The implementation in FIG. 6 has the advantages that it occupies very little silicon area, and delay characteristics can be controlled simply by changing channel length and channel width of transistor 601. In one embodiment, length to width ratio is about 2:1.

The procedure for designing transistor 601 is as follows:

1) Determine the amount of time delay Td needed for buffer 21 to switch a large load from Vcc to about 10% of Vcc, assuming worst case conditions for processing N-channel transistors.
2) Select minimum width for transistor 601, and increase the length until, assuming best case conditions for processing P-channel transistors, the time required for transistor 601 to charge node C above the trip point of AND gate U3 in response to signal A going low exceeds time Td. Assume the same temperature and voltage conditions as used in step 1.

This design procedure will assure that the delay during slow slew rate is sufficient to allow voltage transition at pad 23 without significant disturbance in the ground voltage.

Transistor 602 is an N-channel transistor in which both length and width are minimum sizes for the technology. In one embodiment the length to width ratio is 1:2.4.

Figure 7:
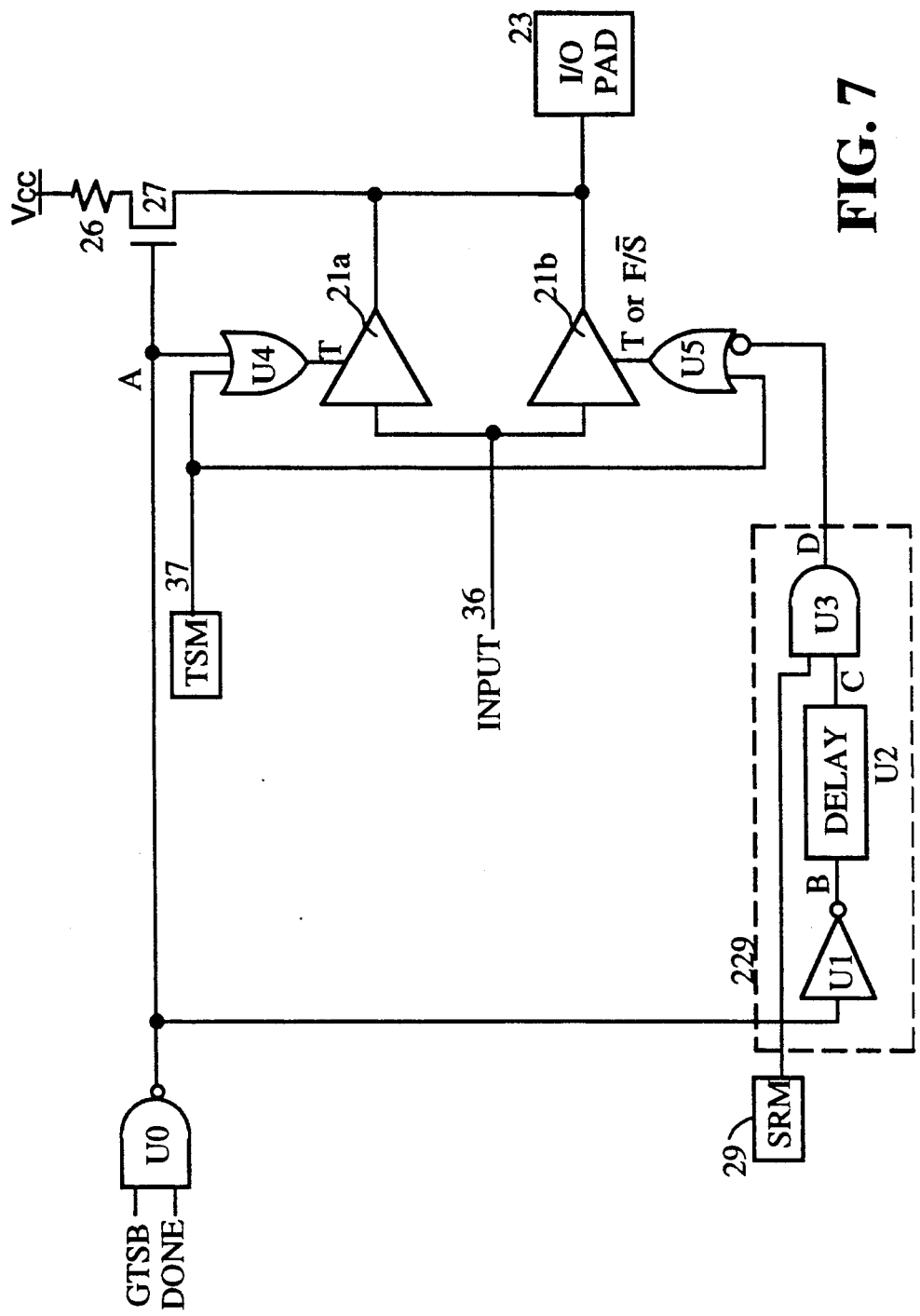
FIG. 7 shows another embodiment of the slew rate control circuit according to the present invention.

FIG. 7 shows another embodiment of the present invention. The circuit of FIG. 7 achieves a variation in slew rate, as does the circuit of FIG. 3, but by using a pair of buffers of which one is turned off to achieve slow slew rate and both are turned on to achieve fast slew rate. Buffer 21a is a device which alone inherently responds slowly to an input signal. Buffers 21a and 21b together respond quickly to an input signal. These can both be simple CMOS buffers. FIG. 8 shows a simple buffer circuit which can be used to implement buffers 21a and 21b of FIG. 7. However, buffers 21a and 21b may differ in transistor size and current carrying capacity. When signal A goes low, if high impedance mode control signal TSM is low, signal T controlling buffer 21a also quickly goes low, turning on buffer 21a. But since buffer 21a is small, there is a slow response to the input signal on line 36. As with the embodiment of FIG. 3, the low signal A generates a high signal on line D after time delay Td. Thus if TSM is low, after a time delay Td, buffer 21b turns on and the combination of buffers 21a and 21b produces a fast response to signals on line 36.

In light of the above discussion, other embodiments of the invention will become obvious to those skilled in the art. Such additional embodiments are intended to fall within the scope of the present invention.

We claim:
1. A soft wakeup output buffer comprising:
a buffer (21) for generating a corresponding output signal (to I/O pad 23) from an input signal (36);
means (T) responsive to a high impedance control signal (A) for placing said buffer into a high impedance mode;
means ($\overline{FS}$) responsive to a slew rate signal (D) for controlling response rate of said buffer; and
means (229) responsive to said high impedance control signal for controlling said slew rate signal (D) comprising:
a logic gate (U3) having two inputs which generates said slew rate signal (D);
means for generating a first slew rate control signal and providing said first slew rate control signal to a first input of said logic gate; and
means for generating a second slew rate control signal which
receives said high impedance control signal (A); and
applies a delay of time Td to said high impedance control signal (A) and after time Td applies said high impedance control signal (A) to a second input of said logic gate (U3).

* * * * *